United States Patent
Wu et al.

(10) Patent No.: US 9,759,761 B2
(45) Date of Patent: Sep. 12, 2017

(54) METHOD AND APPARATUS FOR MONITORING CAPACITOR BUSHINGS FOR A THREE-PHASE AC SYSTEM

(71) Applicant: Maschinenfabrik Reinhausen GmbH, Regensburg (DE)

(72) Inventors: Junliang Wu, Regensburg (DE); Karsten Viereck, Regensburg (DE); Ulrich Sundermann, Dortmund (DE)

(73) Assignee: MASCHINENFABRIK REINHAUSEN GMBH, Regensburg (DE)

( * ) Notice: Subject to any disclaimer, the term of this patent is extended or adjusted under 35 U.S.C. 154(b) by 0 days.

(21) Appl. No.: 15/027,772

(22) PCT Filed: Nov. 11, 2014

(86) PCT No.: PCT/EP2014/074254
§ 371 (c)(1),
(2) Date: Apr. 8, 2016

(87) PCT Pub. No.: WO2015/071253
PCT Pub. Date: May 21, 2015

(65) Prior Publication Data
US 2016/0252564 A1    Sep. 1, 2016

(30) Foreign Application Priority Data
Nov. 15, 2013 (DE) .......... 10 2013 112 584

(51) Int. Cl.
*G01R 31/12* (2006.01)
*G01R 15/06* (2006.01)

(52) U.S. Cl.
CPC ......... *G01R 31/1263* (2013.01); *G01R 15/06* (2013.01)

(58) Field of Classification Search
CPC  G01R 31/025; G01R 31/2834; G01R 33/072; G01R 31/282; G01R 31/31725;
(Continued)

(56) References Cited

U.S. PATENT DOCUMENTS 4,757,263 A    7/1988  Cummings
4,914,382 A *  4/1990  Douville ............... G01R 15/06
                                                    324/102

(Continued)

FOREIGN PATENT DOCUMENTS

EP    0337265 A    10/1989
EP    1039304 A    9/2000

*Primary Examiner* — Melissa Koval
*Assistant Examiner* — Trung Nguyen
(74) *Attorney, Agent, or Firm* — Andrew Wilford

(57) ABSTRACT

A three-phase alternating current mains has capacitor bushings that each have a conductor connected with one of the mains lines of the alternating current mains and an electrically conductive lining surrounding the conductor. These bushings are monitored by first determining an upper capacitance and a lower capacitance for each bushing and then detecting a measured voltage between the respective lining and a ground potential at each capacitor bushing. An actual capacitance for each capacitor bushing is calculated that depends on the respective measured voltage and the respective lower capacitance as well as on the measured voltage, the lower capacitance, and the upper capacitance of one of the other capacitor bushings. For each capacitor bushing the respective upper capacitance is compared with the respective actual capacitance and a monitoring signal is generated that is dependent on the results of the capacitance comparison.

22 Claims, 3 Drawing Sheets

(58) Field of Classification Search
CPC .. G01R 31/1263; G01R 15/06; G01N 27/416; G01N 2021/178
USPC .. 324/537–552, 500, 750.01, 521, 600, 617, 324/622, 683, 709, 66
See application file for complete search history.

(56) References Cited

U.S. PATENT DOCUMENTS

| | | | | |
|---|---|---|---|---|
| 6,028,430 | A | * | 2/2000 | Frielingsdorf ......... G01R 15/06 324/519 |
| 6,873,159 | B2 | | 3/2005 | Koch |

* cited by examiner

METHOD AND APPARATUS FOR MONITORING CAPACITOR BUSHINGS FOR A THREE-PHASE AC SYSTEM

CROSS REFERENCE TO RELATED APPLICATIONS

This application is the US-national stage of PCT application PCT/EP2014/074254 filed 11 Nov. 2014 and claiming the priority of German patent application 102013112584.0 itself filed 15 Nov. 2013.

FIELD OF THE INVENTION

The invention relates to a method and an apparatus for monitoring capacitor bushings for a three-phase alternating current mains.

BACKGROUND OF THE INVENTION

DE 195 19 230 [U.S. Pat. No. 6,028,430] describes a monitoring method and a monitoring arrangement for a capacitor bushing for high voltages, the bushing having a tap for a component voltage between its capacitor linings. This known method provides that the component voltage is fed to a detection device that monitors the component voltage for a change, that a change in the component voltage and time information with respect thereto are stored, that the interval between at least two changes is detected and that a fault signal corresponding with the frequency of the component voltage change is generated. This known apparatus comprises a detection device in which the component voltage is monitored for a change, a memory in which a change in the component voltage and time information with respect thereto are filed, a computing element by means of which the interval between at least two changes is detected, and means for generating a fault signal, in which case a fault signal proportional to the frequency of the component voltage change is generated. The tap is led to the detection device by a measurement line via a measurement bushing. The tap delivers a component voltage corresponding with an image of the high voltage present at the interior of the capacitor bushing.

Since the high voltage present at the capacitor bushing has an influence on the measurement signals and can appreciably fluctuate, the measured values detected at the tap can significantly vary. Reliable monitoring of the capacitor bushing is thus not guaranteed.

DE 100 37 432 [U.S. Pat. No. 6,837,432] describes a method and an apparatus for monitoring a capacitor bushing that is acted on by an electrical operating voltage and in which a voltage divider is formed by an electrically conductive lining. In this known method it is provided that at least one measured value of an electrical measurement variable is detected by a measuring tap connected with the lining and by ground potential and is stored, where after detection of the at least one measured value the impedance between the measuring tap and the ground potential is changed and at least one signal value of a measurement signal that then forms is detected by the measuring tap and the ground potential and is stored, where the interval between the instant of detection of the at least one measured value and the instant of detection of the at least one signal value is so dimensioned that possible changes in the operating voltage between the two instants are negligible, where on the basis of the measured value and the signal value a characteristic variable, which is compared with a predetermined target value, is determined by quotient formation and where in the case of deviation of the characteristic variable from the predetermined target value a report signal indicating a fault of the capacitor bushing is formed. In this known apparatus a measuring tap, which is connected with the lining and with a measurement device for detection of an electrical measurement variable, is provided, where the impedance present between the measuring tap and ground potential contains an impedance arrangement with which a switching device is associated. The impedance arrangement has a fixed impedance that is contestable with the measuring tap by a switching device and is separable from the measuring tap. The switching device is connected with a control device. In order to monitor the capacitor bushing the impedance arrangement is initially in a first measuring state in which the switching device is open and the fixed impedance is not connected with the measuring tap. In this first measuring state a measured value of an electrical measurement variable is detected at a first instant and stored in a memory in the sensor. This measurement variable is here the electrical voltage present at the measuring tap relative to ground potential. In this measuring state of the impedance arrangement the impedance is formed by the parallel circuit of the capacitance and the internal resistance of the measuring apparatus. The impedance in this measuring state is termed unchanged impedance. After detection of the measurement variable, the impedance arrangement is transferred to a second measuring state. For that purpose the control device is shifted by the switching device in controlled manner to the closed state. As a result, the fixed impedance is now electrically conductively connected with the measuring tap. The impedance is now formed from the parallel circuit of the capacitance, the internal resistance of the sensor and the fixed impedance. In this second measuring state a signal value of a measurement signal that forms is now detected by the sensor at a second instant and is similarly stored. The measurement signal is the electrical voltage present at the measuring tap relative to ground potential. In this second measuring state the impedance is termed changed impedance.

Since the operating voltage present at the capacitor bushing influences the measurement signals and can strongly fluctuate, the measured values detected at the measuring tap significantly vary. Reliable monitoring of the capacitor bushing thus is not guaranteed.

DE 36 01 934 C2 describes a permanently monitored capacitor bushing arrangement in large-size transformers in three-phase current mains, with three capacitor bushings—each of which consists of a winding body with embedded capacitor linings—each with a measurement terminal connected with the last, outer capacitor lining and with an outer flange capacitance between the last, outer capacitor lining and the earthed flange of each bushing. In this known capacitor bushing arrangement it is provided that the measurement terminals of the three capacitor bushings are each connected by a respective trimming capacitor with an artificial star point settable to ground potential, where a sensor is arranged between the artificial star point and the ground potential. Provision is made for the sensor to be connected with a trigger device that switches off the entire arrangement in the event of change in capacitance of the capacitor linings.

U.S. Pat. No. 4,757,263 A describes determination of capacitance values for monitoring the insulating characteristics of high-voltage bushings.

OBJECT OF THE INVENTION

It is an object of the invention to create a method and an apparatus for monitoring capacitor bushings for a three-phase alternating current mains, which make possible better monitoring.

SUMMARY OF THE INVENTION

This object is fulfilled according to a first aspect the invention by a method of monitoring capacitor bushings for a three-phase alternating current mains, where each capacitor bushing comprises a conductor, which is connected with one of the mains lines of the alternating current mains, and an electrically conductive lining surrounding the conductor, comprising the steps:

an upper capacitance $C0a$, $C0b$, $C0c$ and a lower capacitance $C1a$, $C1b$, $C1c$ are determined for each capacitor bushing;

a measured voltage $U1a$, $U1b$, $U1c$ present between the respective lining and a ground potential is detected and/or measured at each capacitor bushing;

an actual capacitance $C0a'$, $C0b'$, $C0c'$ is calculated for each capacitor bushing, the actual capacitance depending on the respective measured voltage and the respective lower capacitance as well as on the measured voltage, the lower capacitance and the upper capacitance of one of the other capacitor bushings;

for each capacitor bushing the respective upper capacitance is compared with the respective actual capacitance; and a monitoring signal dependent on the results of the capacitance comparison is generated.

In the proposed method the upper capacitances of the capacitor bushings and the actual capacitances thereof in operation are compared with one another, here also termed capacitance comparisons. Should an actual capacitance change, it can be concluded that there is damage to the corresponding capacitor bushing.

The proposed method uses the characteristic variables and measurement variables of other capacitor bushings for the actual monitoring. In that regard, use is made of the measured voltages, lower capacitances, upper capacitances and actual capacitances of a capacitor bushing as well as one of the other capacitor bushings. It is thereby achieved that in the monitoring of a capacitor bushing, which is of course connected with the mains line associated therewith, at least partial compensation for fluctuations of the mains voltage present at a mains line, which fluctuations are transmitted to the measurement voltage by the capacitor bushing connected with the respective mains line, as well as measuring tolerances in the detection of the measurement voltage, can be provided and a better statement with regard to the state of the capacitor bushing can be made.

The upper capacitance for each capacitor bushing can be defined in any desired mode and manner according to need, for example as the capacitance of a capacitor that is formed by the respective lining and the respective conductor and is here termed upper voltage capacitor. The upper capacitances usually lie between 300 and 600 pF.

Each capacitor bushing can be formed in any desired mode and manner according to need and comprise, for example, at least one additional lining that is arranged, in particular, between the first-mentioned lining and the conductor so that this first-mentioned lining represents an outermost lining. The upper capacitance can then also be defined as, for example, the capacitance of a series circuit comprising capacitors, which are each formed by two adjacent linings, as well as a capacitor, which is formed by the innermost one of the additional linings and the conductor, and is here similarly termed upper voltage capacitor.

The lower capacitance for each capacitor bushing can be defined in any desired mode and manner according to need, for example as the capacitance of a parallel circuit, which is here termed lower voltage capacitor and which comprises a sensor, by which, for example, the respective measured voltage can be detected and/or measured, and a capacitor, which is here termed outer capacitor and which is formed by the respective outermost lining and ground potential or by the respective outermost lining and an electrically conductive flange fastened to the outer surface of the respective capacitor bushing and lying at ground potential. The lower capacitances usually lie between 1 µF and 5 µF, but if required they can also have other values and lie between, for example, 0.1 µF and 50 µF or 0.2 µF and 20 µF or 0.5 µF and 10 µF. Alternatively or additionally each of these lower capacitances and at least one of the other lower capacitances can be the same or different. For example, the lower capacitances can be in a ratio of 1:2:3, 1:2:4, 1:2:5, 1:3:5, 1:3:7, 1:3:9, 1:4:7 or 1:4:9.

The monitoring signal can be formed in any desired mode and manner according to need, for example as an acoustic and/or optical and/or electronic signal.

Determination of the upper capacitance for a capacitor bushing can be carried out in any desired mode and manner according to need, for example by measuring, preferably at an undamaged or fault-free capacitor bushing, or by being taken from a data sheet of the capacitor bushing or by setting to an empirical value or by taking over from an earlier cycle of the method. Alternatively or additionally, determination of at least one upper capacitance can be carried out, for example, before, after or at the same time as determination of at least one of the other upper capacitances and/or before, after or at the same time as determination of at least one lower capacitance and/or before, after or at the same time as detection of at least one measured voltage.

Determination of the lower capacitance for a capacitor bushing can be carried out in any desired mode and manner according to need, for example by measuring, preferably at an undamaged or fault-free capacitor bushing, or by being taken from a data sheet of the capacitor bushing or by setting to an empirical value or by taking over from an earlier cycle of the method. Alternatively or additionally, determination of at least one lower capacitance can be carried out, for example, before, after or at the same time as determination of at least one of the other lower capacitances and/or before, after or at the same time as determination of at least one upper capacitance and/or before, after or at the same time as detection of at least one measured voltage.

Detection of at least one measured voltage can be carried out in any desired mode and manner according to need, for example before, after or—preferably—at the same time as detection of at least one of the other measured voltages and/or before, after or at the same time as determination of at least one upper capacitance and/or before, after or at the same time as determination of at least one lower capacitance.

It can be provided that
the mains voltage $Ua$, $Ub$, $Uc$ is detected and/or measured for each phase;
the mains voltages are compared with one another; and
if the voltage comparison has the result that the mains voltages differ from one another by not more than a predetermined amount the calculation of the actual capacitances, the comparison of the capacitances and the generation of the monitoring signal take place.

This comparison of the mains voltages, here also termed voltage comparison, enables determination of an instant at which the actual monitoring—namely the calculation of the actual capacitances, the capacitance comparisons and the generation of the monitoring signal—is particularly advantageous or favourable, since it then is not made difficult or hindered or even made impossible by mains voltages differing from one another by more than the predetermined amount. It is thus achieved that regardless of fluctuations of the mains voltages as well as of measurement tolerances during the detection of the measured voltages a better statement about the state of the capacitor bushes can be made.

Through consideration of the mains voltages it is possible, for example, to detect changes over time of the voltage ratios, which are also termed asymmetries, and to thus provide at least partial compensation for corresponding deviations of the measured voltages measured at the capacitor bushings. A reliable monitoring of the capacitor bushings with consideration and evaluation of the differences and the disturbances in the mains voltages is thus guaranteed.

Detection of at least one mains voltage can be carried out in any desired mode and manner according to need, for example before, after or—preferably—at the same time as detection of at least one of the other mains voltages and/or after, at the same time as or—preferably—before determination of at least one upper capacitance and/or after, at the same time as or—preferably—before determination of at least one lower capacitance and/or after, at the same time as or—preferably—before detection of at least one measured voltage.

The voltage comparison can be carried in any desired mode and manner according to need, for example after, at the same time as or—preferably—before determination of at least one upper capacitance and/or after, at the same time as or—preferably—before determination of at least one capacitance and/or after, at the same time as or—preferably—before detection of at least one measured voltage. If the voltage comparison has the result that the mains voltages no longer differ from one another by more than a predetermined amount then preferably determination of the upper capacitances and/or determination of the lower capacitances and/or detection of the measured voltages and finally calculation of the actual capacitances, comparison of the capacitances and generation of the monitoring signal are carried out.

If the voltage comparison has the result that the mains voltages differ from one another by more than a predetermined amount, then the calculation of the actual capacitances, the comparison of the capacitances and the generation of the monitoring signal are not carried out, but a new cycle of the method takes place. Then, for preference, determination of the upper capacitances and/or determination of the lower capacitances and/or detection of the measured voltages is or are also not carried out.

After generation of the monitoring signal, a new, next or further cycle of the method preferably takes place.

It can be provided that
effective values Uae, Ube, Uce and/or peak values and/or amplitudes of the mains voltages Ua, Ub, Uc are used in the voltage comparison.

It can be provided that
tolerance values UAB>0, UBC>0, UCA>0 for the voltage comparison are determined; and the voltage comparison is carried out in such a way that it is checked whether |Uae−Ube|≤UAB and |Ube−Uce|≤UBC and |Uce−Uae|≤UCA.

Each of these tolerance values UAB, UBC, UCA can be determined in any desired mode and manner according to need and, for example, set to a value corresponding with 0.1%, 0.2%, 0.5%, 1%, 2%, 3%, 4%, 5%, 7%, 10% 15%, 20%, 25%, 30%, 40% or 50% of the rated value of the respective mains voltage Uae, Ube, Uce. Each of these tolerance values and at least one of the other tolerance values can be the same or different.

It can be provided that
the actual capacitance of the first capacitor bushing is calculated according to the following formula:

$$C'_{0a} = C_{1a} \times \frac{U_{1a} \times K_a}{\frac{U_{1b} \times C_{1b}}{C_{0b}} + U_{1b} - U_{1a} \times K_a}$$

where Ka is a correction value for which Ka=1 or Ka=Ub/Ua or Ka=Ube/Uae; and/or the actual capacitance of the second capacitor bushing is calculated according to the following formula:

$$C'_{0b} = C_{1b} \times \frac{U_{1b} \times K_b}{\frac{U_{1c} \times C_{1c}}{C_{0c}} + U_{1c} - U_{1b} \times K_b}$$

where Kb is a correction value for which Kb=1 or Kb=Uc/Ub or Kb=Uce/Ube; and/or the actual capacitance of the third capacitor bushing is calculated according to the following formula:

$$C'_{0c} = C_{1c} \times \frac{U_{1c} \times Kc}{\frac{U_{1a} \times C_{1a}}{C_{0a}} + U_{1a} - U_{1c} \times Kc}$$

where Kc is a correction value for which Kc=1 or Kc=Ua/Uc or Kc=Uae/Uce.

A correction value—for which the second alternative, thus the quotient of two mains voltages, applies—provides or enables automatic correction of and/or automatic compensation for asymmetries and/or differences between these two mains voltages. An even more precise determination of the corresponding actual capacitance can thereby be achieved.

Each of these correction values can be selected as desired according to need. If, for example, in each instance the first alternative is selected for the correction values, thus Ka=Kb=Kc=1, then the voltage comparison should preferably be used before the actual monitoring and in that case, with further preference, each of the tolerance values UAB, UBC, UCA should be set to a rather low value that corresponds with, for example, 0.1%, 0.2%, 0.5%, 1%, 2%, 3%, 4%, 5%, 7% or 10% of the rated value of the respective mains voltage Uae, Ube, Uce. If, for example, in each instance the second alternative, thus Ka=Ub/Ua and Kb=Uc/Ub and Kc=Ua/Uc, is selected for the correction values then according to need the voltage comparison before the actual monitoring can be dispensed with or the voltage comparison can take place before the actual monitoring and in that case preferably each of the tolerance values UAB, UBC, UCA is set to a rather higher value that corresponds with, for example, 2%, 3%, 4%, 5%, 7%, 10%, 15%, 20%, 25%, 30%, 40% or 50% of the rated value of the respective mains voltage Uae, Ube, Uce.

Calculation of at least one actual capacitance can be carried out in any desired mode and manner according to need, for example before, after or at the same time as calculation of at least one of the other actual capacitances.

It can be provided that
tolerance values CA>0, CB>0, CC>0 for the capacitance comparisons are determined; and
if the capacitance comparisons have the result that |C0a'−C0a|≤CA and |C0b'−C0b|≤CB and |C0c'−C0c|≤CC
a monitoring signal is generated that indicates that the capacitor bushings are in an orderly state.

Thus, after determination of the tolerance values the capacitance comparisons are evaluated in a checking step, here also termed first evaluating or first evaluation, and a monitoring signal dependent on the result of this first evaluation is generated.

Each of these tolerance values CA, CB, CC can be determined in any desired mode and manner according to need and are, for example, set to a value corresponding with 0.001%, 0.002%, 0.003%, 0.004%, 0.005%, 0.007%, 0.01%, 0.012%, 0.015% or 0.02% of the respective upper capacitance C0a, C0b, C0c or a mean value of the upper capacitances C0a, C0b, C0c. This mean value can be selected as desired in accordance with need, for example as the arithmetic mean, geometric mean, harmonic mean or square mean. Each of these tolerance values and at least one of the other tolerance values can be the same or different.

It can be provided that
otherwise a monitoring signal is generated that indicates that at least one capacitor bushing is not in an orderly state.

Thus, this monitoring signal is generated if the first evaluation has the result that the checked case is not present.

It can be provided that
tolerance values CA>0, CB>0, CC>0 for the capacitance comparisons are determined;
if the capacitance comparisons have the result that C0a'−C0a<−CA and C0b'−C0b CB and |C0c'−C0c|≤CC
a monitoring signal is generated that indicates that at least the second capacitor bushing is not in an orderly state;
if the capacitance comparisons have the result that C0b'−C0b<−CB and C0c'−C0c CC and |C0a'−C0a|≤CA a monitoring signal is generated that indicates that at least the third capacitor bushing is not in an orderly state; and
if the capacitance comparisons have the result that C0c'−C0c<−CC and C0a'−C0a CA and |C0b'−C0b|≤CB
a monitoring signal is generated that indicates that at least the first capacitor bushing is not in an orderly state.

Thus, after determination of the tolerance values the capacitance comparisons are evaluated in four checking steps, also termed here second evaluating or second evaluation, and a monitoring signal dependent on the result of this second evaluation is generated. Each of these checking steps can be carried out in any desired mode and manner according to need, for example before, after or at the same time as at least one other checking step.

Each of these tolerance values CA, CB, CC can be determined in any desired mode and manner according to need and, for example, set to a value corresponding with 0.001%, 0.002%, 0.003%, 0.004%, 0.005%, 0.007%, 0.01%, 0.012%, 0.015% or 0.02% of the respective upper capacitances C0a, C0b, C0c or a mean value of the upper capacitances C0a, C0b, C0c. This mean value can be selected as desired according to need, for example as the arithmetic mean, geometric mean, harmonic mean or square mean. Each of these tolerance values and at least one of the other tolerance values can be the same or different. If tolerance values CA, CB, CC have already been determined on one occasion, for example for the first evaluation or for the third evaluation described further below, then these can preferably also be adopted for this second evaluation.

It can be provided that
otherwise a monitoring signal is generated that indicates that at least two capacitor bushings are not in an orderly state.

Thus, this monitoring signal is generated if the second evaluation has the result that the checked cases are not present.

It can be provided that
tolerance values CA>0, CB>0, CC>0 for the capacitance comparisons are determined;
if the capacitance comparisons have the result that C0a'−C0a CA and C0b'−C0b<−CB and |C0c'−C0c|≤CC
a monitoring signal is generated that indicates that the first and third capacitor bushings are not in an orderly state and have an identical fault;
if the capacitance comparisons have the result that C0b'−C0b CB and C0c'−C0c<−CC and |C0a'−C0a|≤CA
a monitoring signal is generated that indicates that the second and first capacitor bushings are not in an orderly state and have an identical fault; and
if the capacitance comparisons have the result that C0c'−C0c CC and C0a'−C0a<−CA and |C0b'−C0b|≤CB
a monitoring signal is generated that indicates that the third and second capacitor bushings are not in an orderly state and have an identical fault.

Thus, after determination of the tolerance values the capacitance comparisons are evaluated in three checking steps, also termed here third evaluating or third evaluation, and a monitoring signal dependent on the result of this third evaluation is generated. Each of these checking steps can be carried out in any desired mode and manner according to need, for example before, after or at the same time as at least one of the other checking steps.

Each of these tolerance values CA, CB, CC can be carried out in any desired mode and manner according to need and, for example, set to a value corresponding with 0.001%, 0.002%, 0.003%, 0.004%, 0.005%, 0.007%, 0.01%, 0.012%, 0.015% or 0.02% of the respective upper capacitance C0a, C0b, C0c or a mean value of the upper capacitances C0a, C0b, C0c. This mean value can be selected as desired according to need, for example as the arithmetic mean, geometric mean, harmonic mean or square mean. Each of these tolerance values and at least one of the other tolerance values can be the same or different. If tolerance values CA, CB, CC have already been determined on one occasion, for example for the first or the second evaluation, then these can preferably also be adopted for this second evaluation.

According to a second aspect the invention proposes an apparatus for monitoring capacitor bushings for a three-phase alternating current mains, where each capacitor bushing comprises a conductor, which is connected with one of the mains lines of the alternating current mains, and an electrically conductive lining surrounding the conductor, where the apparatus is constructed and/or is suitable and/or serves particularly for carrying out one of the proposed methods and has or comprises:

a sensor;
a measuring adapter for each phase, which adapter can be connected with the lining of the capacitor bushing belonging to the respective phase and is connected with the sensor so as to detect and/or measure a first electrical measurement variable; and
a controller that is connected with the sensor so as to communicate the first measurement variable to the controller.

Through bringing the first measurement variables together in a controller it is possible to arrange central monitoring and thus detect fluctuations of the mains voltages in all phases of the alternating current mains during monitoring of all capacitor bushings. Reliable monitoring of the capacitor bushings is thus guaranteed.

This apparatus proposed in accordance with the second aspect enables continuous monitoring of the capacitor bushings.

With the apparatus proposed in accordance with the second aspect it is possible, for example, to carry out the proposed method.

The apparatus proposed in accordance with the second aspect can be constructed in any desired mode and manner according to need and, for example, comprise at least one further sensor and/or at least one further measuring adapter and/or at least one further controller. It is possible to provide, for example, an individual sensor and/or an individual controller for each measuring adapter. Alternatively, the sensor can be constructed as a common sensor for at least two or for all measuring adapters.

The controller can be constructed in any desired mode and manner according to need, for example as a common controller for at least two or for all sensors. Alternatively or additionally, it can comprise, for example an upper controller and, for each phase, an individual lower controller, which is connected with the sensor belonging to the respective phase and with the upper controller.

The mains line can be constructed in any desired mode and manner according to need, for example as a high-voltage line.

The apparatus proposed in accordance with the second aspect is preferably constructed in such a way that it carries out and/or can carry out one of the proposed methods.

It can be provided that the apparatus proposed in accordance with the second aspect additionally has or comprises
a voltage converter for each phase, which converter can be connected with the mains line belonging to the respective phase so as to detect and/or measure a second electrical measurement variable and is connected with the controller so as to communicate the second measurement variable to the controller.

Through use of the second measurement variables, which are detected by the voltage converters at the mains lines, it is possible to detect and/or recognise changes over time and/or fluctuations over time of the mains voltages and/or ratios of the mains voltages such as, for example, transient phenomena or asymmetries, and compare them with, for example, the first measurement variables and/or the changes and/or fluctuations thereof over time. Reliable monitoring of the capacitor bushings with consideration and evaluation of the changes in and/or fluctuations of the mains voltage is thus ensured.

The controller can be constructed in any desired mode and manner according to need, for example as a common controller for at least two or for all sensors and/or for at least two or all voltage converters. Alternatively or additionally, it can comprise, for example, an upper controller and, for each phase, an individual controller, which is connected with the sensor belonging to the respective phase, with the voltage converter belonging to the respective phase and with the upper controller.

It can be provided that
each voltage converter is constructed as a capacitive voltage converter or inductive voltage converter or resistive voltage converter.

Each voltage converter can be constructed in any desired mode and manner according to need and/or be realised by means of different appropriate principles. It can, for example, be constructed inductively and/or capacitively and/or resistively and/or comprise inductive and/or capacitive and/or resistive components and/or parts. For preference it can comprise a capacitive voltage divider, which comprises two capacitors connected in series, and two coils or windings, which are connected as a transformer for inductive electrical isolation.

It can be provided that
the sensor or at least one of the sensors comprises at least one measuring capacitor.

The capacitance of at least one of the measuring capacitors is preferably greater than the capacitance of the respective outer capacitor by a multiple.

The capacitances of the measuring capacitors usually lie between 1 and 5 µF, but according to need they can also have other values and lie, for example, between 0.1 and 50 or 0.2 µF and 20 µF or 0.5 µF and 10 µF.

The capacitances of the measuring capacitors can be selected in any desired mode and manner according to need. Thus, for example, for the case that in each phase a measuring adapter is connected with an individual measuring capacitor associated only with that adapter and these three measuring capacitors are combined in a common sensor or distributed to three individual sensors associated with the measuring adapters, the capacitances of these three measuring capacitors can be the same or two of these capacitors can be the same as and different from the third capacitance or all three capacitances can be different. These three capacitances can, for example, be in the ratio 1:2:3, 1:2:4, 1:2:5, 1:3:5, 1:3:7, 1:3:9, 1:4:7 or 1:4:9 to one another.

It can be provided that
the first measurement variables are electrical voltages respectively applied to a lower voltage capacitor of the respective phase.

Each lower voltage capacitor can be constructed in any desired mode and manner according to need and have, for example, a capacitance—which is here termed lower capacitance—between 0.1 µF and 50 µF or 0.2 µF and 20 µF or 0.5 µF and 10 µF or 1 µF and 5 µF. Alternatively or additionally, each of these lower capacitances and at least one of the other lower capacitances can be the same or different. For example, the lower capacitances can be in the ratio 1:2:3, 1:2:4, 1:2:5, 1:3:5, 1:3:7, 1:3:9, 1:4:7 or 1:4:9 to one another.

It can be provided that
the second measurement variables are electrical voltages each applied between the respective mains line and ground potential.

These voltages are also termed mains voltages here.

It can be provided that
the controller is so constructed that it
calculates or can calculate an actual capacitance for each capacitor bushing, the actual capacitance depending on the respective measured voltage and a lower capacitance of the respective capacitor bushing as well as on the measurement voltage, a lower capacitance and an upper capacitance of one of the other capacitor bushings.

It can be provided that
the controller is so constructed that it
compares or can compare the respective upper capacitance with the respective actual capacitance for each capacitor bushing.

According to a third aspect the invention proposes an apparatus for monitoring capacitor bushings for a three-phase alternating current mains, where each capacitor bushing comprises a conductor, which is connected with the one of the mains lines of the alternating current mains, and an electrically conductive lining surrounding the conductor, where the apparatus is constructed particularly as one of the apparatuses proposed in accordance with the second aspect and has or comprises means constructed and/or serving and/or suitable to detect and/or measure at each capacitor bushing a measurement voltage U1$a$, U1$b$, U1$c$ applied between the respective lining and a ground potential;

means constructed and/or serving and/or suitable to calculate for each capacitor bushing an actual capacitance C0$a'$, C0$b'$, C0$c'$ that depends on the respective measurement voltage U1$a$, U1$b$, U1$c$ and a lower capacitance C1$a$, C1$b$, C1$c$ of the respective capacitor bushing as well as on the measurement voltage U1$b$, U1$c$, U1$a$, a lower capacitance C1$b$, C1$c$, C1$a$ and an upper capacitance C0$b$, C0$c$, C0$a$ of one of the other capacitor bushings;

means constructed and/or serving and/or suitable to compare the respective upper capacitance C0$a$, C0$b$, C0$c$ with the respective actual capacitance C0$a'$, C0$b'$, C0$c'$ for each capacitor bushing; and means constructed and/or serving and/or suitable to generate a monitoring signal dependent on the results of the capacitance comparisons.

Through bringing together the measured voltages in the means for detecting the measured voltages it is possible to arrange a central monitoring and thus to detect the fluctuations of the mains voltages in all phases of the alternating current mains in the case of monitoring all capacitor bushings. Reliable monitoring of the capacitor bushings is thus ensured.

This apparatus proposed in accordance with the third aspect can compare the upper capacitances of the capacitor bushings as well as the actual capacitances thereof in operation with one another, also termed here capacitance comparisons. If an actual capacitance should change, it can be concluded that there is damage to the corresponding capacitor bushing.

The apparatus proposed in accordance with the third aspect makes continuous monitoring of the capacitor bushings possible.

It is possible to carry out, for example, one of the proposed methods by the apparatus proposed in accordance with the third aspect.

The apparatus proposed in accordance with the third aspect can be constructed in any desired mode and manner according to need, for example as one of the apparatuses proposed in accordance with the second aspect.

The means for detecting the measured voltages can be constructed in any desired mode and manner according to need and, for example, be connected with means for calculating the actual capacitances and/or means for the capacitance comparisons and/or comprise a sensor and/or, for each phase, a measuring adapter, which can be connected with the lining of the capacitor bushing belonging to the respective phase and with the sensor so as to detect and/or measure the respective measured voltage.

The means for calculating the actual capacitance can be constructed in any desired mode and manner according to need and, for example, be connected with the means for detecting the measured voltages and/or the means for the capacitance comparisons and/or comprise a controller that is connected with the sensor in order to communicate the measured voltages to the controller.

It is possible, for example, for an individual sensor and/or individual controller to be provided for each measuring adapter. Alternatively, the sensor can be constructed as a common sensor for at least two or for all measuring adapters.

The means for the capacitance comparisons can be constructed in any desired mode and manner according to need and, for example, be connected with the means for detecting the measured voltages and/or the means for calculating the actual capacitances and/or the controller can comprise the means for calculating the actual capacitances and/or an individual controller and/or be brought together or combined with the means for calculating the actual capacitances so as to form a common means or be realised by the means for calculating the actual capacitances or be included in the means for calculating the actual capacitances or include the means for calculating the actual capacitances.

The means for generating the monitoring signal can be constructed in any desired mode and manner according to need and, for example, be connected with the means for the capacitance comparisons and/or comprise at least one acoustic signal transmitter and/or at least one optical signal transmitter and/or at least one electronic signal transmitter and/or be included in the means for calculating the actual capacitances and/or in the means for the capacitance comparisons.

It can be provided that the apparatus proposed in accordance with third aspect additionally has or comprises means constructed and/or serving and/or suitable for detecting and/or measuring the mains voltages Ua, Ub, Uc of each phase;

means constructed and/or serving and/or suitable for comparing the mains voltages with one another; and means constructed and/or serving and/or suitable for causing or executing or carrying out or starting the calculation of the actual capacitances, the comparison of the capacitances and the generation of the monitoring signal if the voltage comparison has the result that the mains voltages do not differ from one another by more than a predetermined amount UAB, UBC, UCA.

Through the use of the mains voltages it is possible to detect and/or recognise changes over time and/or fluctuations over time of the mains voltages such as, for example, transient phenomena or asymmetries and, for example, to compare them with the mains voltages and/or the changes and/or fluctuations thereof over time. A reliable monitoring of the capacitor bushings with consideration and evaluation of the changes in and/or fluctuations of the mains voltage is thus guaranteed.

This comparison of the mains voltages, here also termed voltage comparison, makes it possible to determine an instant at which the actual monitoring, namely the calculation of the actual capacitances, the capacitance comparisons and the generation of the monitoring signal, is particularly advantageous or favourable, since then they are not made difficult or obstructed or even made impossible by mains voltages differing from one another by more than the predetermined amount. It is thus achieved that regardless of the fluctuations of the mains voltages as well as of measurement tolerances during detection of the measured voltages a better statement about the state of the capacitor bushings can be made.

Through the consideration of the mains voltages it is possible to detect, for example, changes over time of the voltage ratios, which are also termed asymmetries, and thus to at least partly provide compensation for the corresponding deviations of the measured voltages measured at the capacitor bushings. A reliable monitoring of the capacitor bushings with consideration and evaluation of the deviations and the disturbances in the mains voltages is thus guaranteed.

The means for causing the calculation of the actual capacitances, the comparison of the capacitances and the generation of the monitoring signal are also termed here, for short, means for causing.

The means for detecting the mains voltages can be constructed in any desired mode and manner according to need and, for example, be connected with the means for the voltage comparison and/or comprise, for each phase, a voltage converter that can be connected with the mains line belonging to the respective phase so as to detect and/or measure the respective measured voltage. They can, for example, be additionally connected with the means for calculating the actual capacitances and/or the means for the capacitance comparisons.

The means for the voltage comparison can be constructed in any desired mode and manner according to need and, for example, can be connected with the means for detecting the mains voltage and/or the means for causing, and/or the controller can comprise the means for calculating the actual capacitances, and/or the controller can comprise the means for the capacitance comparisons and/or an individual controller that is connected with the means for detecting the mains voltages and/or the voltage converters. They can, for example, be additionally connected with the means for calculating the actual capacitances and/or the means for the capacitance comparisons. Alternatively or additionally they can be brought together or combined with the means for calculating the actual capacitances and/or the means for the capacitance comparisons and/or the means for causing so as to form a common means, or be realised by the means for calculating the actual capacitances and/or the means for the capacitance comparisons and/or the means for causing, or be included in the means for calculating the actual capacitances and/or the means for the capacitance comparisons and/or the means for causing, or include the means for calculating the actual capacitances and/or the means for the capacitance comparisons and/or the means for causing.

The means for causing can be constructed in any desired mode and manner according to need and, for example, can be connected with the means for the voltage comparison and/or the means for calculating the actual capacitances and/or the means for the capacitance comparisons and/or the means for generating the monitoring signal, and/or the controller can comprise the means for the voltage comparison, and/or the controller can comprise the means for calculating the actual capacitances, and/or the controller can comprise the means for the capacitance comparisons and/or an individual controller that is connected with the means for the voltage comparison and/or the means for calculating the actual capacitances and/or the means for the capacitance comparisons and/or the means for generating the monitoring signal. Alternatively or additionally they can be brought together or combined with the means for the voltage comparison and/or the means for calculating the actual capacitances and/or the means for the capacitance comparisons so as to form a common means, or be realised by the means for the voltage comparison and/or the means for calculating the actual capacitances and/or the means for the capacitance comparison or be included in the means for the voltage comparison and/or the means for calculating the actual capacitances and/or the means for the capacitance comparisons, or include the means for the voltage comparison and/or the means for calculating the actual capacitances and/or the means for the capacitance comparisons.

It can be provided that
each of the proposed apparatuses is constructed and/or serves and/or is suitable for executing and/or for being able to execute one of the proposed methods.

Each of the methods proposed in accordance with the first aspect and each of the apparatuses proposed in accordance with the second or third aspect enable use of voltage converters that have relatively large measuring tolerances and/or measuring accuracies and preferably belong to the same tolerance class and/or accuracy class, in particular are identical.

The descriptions and explanations with respect to one of the aspects of the invention, particularly to individual features of this aspect, also apply correspondingly in analogous manner to the other aspects of the invention.

BRIEF DESCRIPTION OF THE DRAWING

Embodiments of the invention are explained in more detail in the following by example on the basis of the accompanying drawings. However, the individual features evident therefrom are not restricted to the individual forms of embodiment, but can be connected and/or combined with individual features described further above and/or with individual features of other forms of embodiment. The details in the drawings are to be understood only as explanatory and not as restrictive. In the drawings.

SPECIFIC DESCRIPTION OF THE INVENTION

Figure 1:
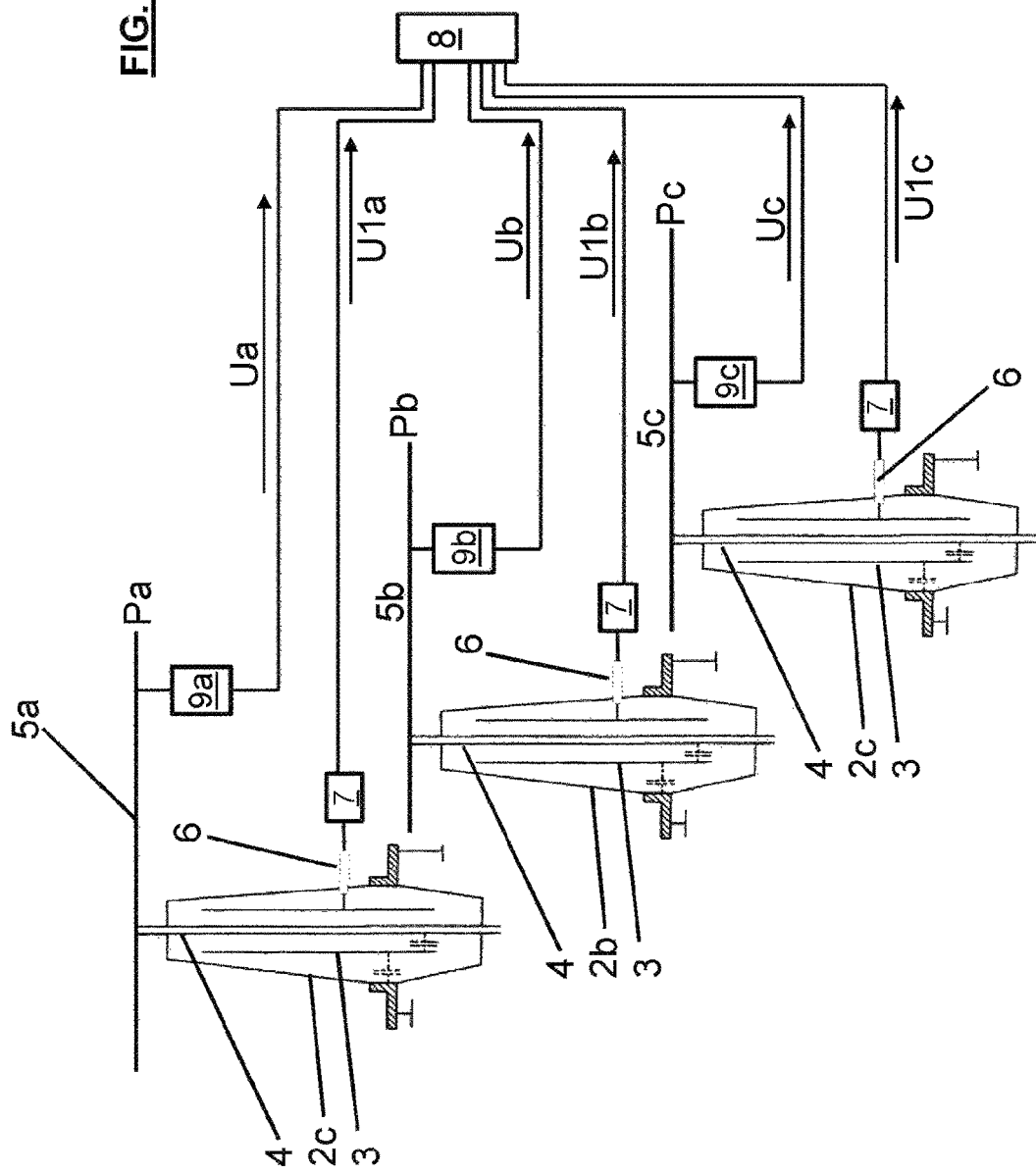
FIG. 1 shows a embodiment of an apparatus for monitoring capacitor bushings for a three-phase alternating current mains.

An embodiment of an apparatus 1 for monitoring capacitor bushings 2a, 2b, 2c for a three-phase alternating current mains is schematically illustrated in FIG. 1. The capacitor bushings 2a, 2b, 2c belong, in this embodiment, to a transformer, which is not illustrated here and that, for example, is here a high-voltage transformer. Capacitor bushings 2a, 2b, 2c of that kind are, for example, used in the case of high voltages in the range of a few kilovolts to a few thousand kilovolts. The alternating current mains is here, by example, a high-voltage mains. Each of the three capacitor bushings 2a, 2b, 2c is associated with a respective one of the three phases Pa, Pb, Pc of the alternating current mains and comprises a conductor 4, which is connected with the respective mains line 5a, 5b, 5c of the alternating current mains, and several electrically conductive linings, which enclose the conductor 4 in several layers or plies and of which merely the outermost lining 3 is illustrated.

The apparatus 1 comprises a controller 8 as well as, for each phase Pa, Pb, Pc, a sensor 7 and a measuring adapter 6, which is connected with the lining 3 of the capacitor bushing 2a, 2b, 2c belonging to the respective phase and with the respective sensor 7 so as to detect a first electrical measurement variable for the respective phase Pa, Pb, Pc. These first measurement variables are here electrical voltages, which are respectively present at a lower voltage capacitor KU1, KU2, KU3—that is described further below and shown in FIG. 3—of the respective phase Pa, Pb, Pc and that are here also termed measurement voltages U1a, U1b, U1c. The controller 8 is connected with each sensor 7 so as to communicate the measured voltages U1a, U1b, U1c to the controller 8 and thus forms a common controller 8 for all sensors 7.

In this embodiment the apparatus 1 additionally comprises, for each phase Pa, Pb, Pc, a voltage converter 9a, 9b, 9c that is connected with the respective mains line 5a, 5b, 5c so as to detect a second electrical measurement variable for the respective phase Pa, Pb, Pc. These second measurement variables are here electrical voltages, which are respectively lie at the individual mains lines 5a, 5b, 5c and ground potential 13 and are also here termed mains voltages Ua, Ub, Uc. The controller 8 is connected with each voltage converter 9a, 9b, 9c so as to communicate the mains voltages Ua, Ub, Uc to the controller 8 and thus forms a common controller 8 for all voltage converters 9a, 9b, 9c.

Through the apparatus 1 the possibility is created of the controller 8 taking into consideration, in the monitoring of the capacitor bushings 2a, 2b, 2c, asymmetries and/or fluctuations of the mains voltages Ua, Ub, Uc on the mains lines 5a, 5b, 5c.

Figure 2:
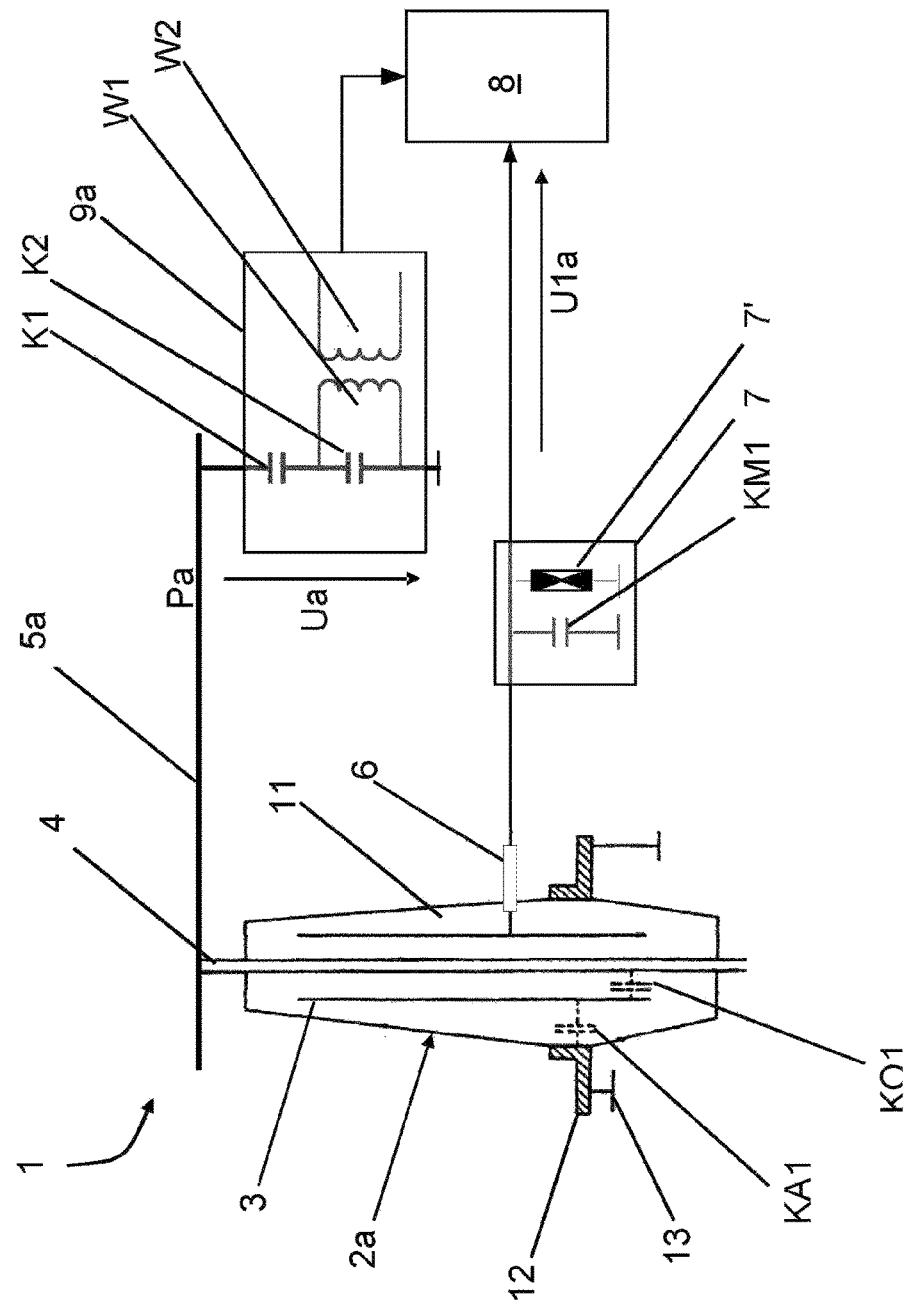
FIG. 2 shows a part of the apparatus of FIG. 1.

A first part, which is associated with a first phase Pa, of the apparatus 1 is illustrated in detail in FIG. 2. A second part of the apparatus 1 associated with a second phase Pb and a third part of the apparatus 1 associated with a third phase Pc correspond in analogous manner with this first part, so that the descriptions and explanations with respect to the first part correspondingly also apply in analogous manner to these two other parts.

The first capacitor bushing 2a associated with a first phase Pa comprises an insulating body 11, through the interior of which the conductor 4 is led. This contacts at its upper end the mains line 5a associated with its capacitor bushing 2a and at its lower end a winding (not illustrated here) of the high-voltage transformer. Embedded in the insulating body 11 are electrically conductive linings that are indicated here only by the outermost lining 3 and that, in electrical terms, form a series circuit of capacitors. This series circuit comprises the capacitors that are respectively formed by two adjacent linings and a capacitor that is formed by the innermost lining (not shown here) and the conductor 4. This series circuit of capacitors between the outermost lining 3 and the conductor 4 forms, as equivalent circuit for each capacitor bushing 2a, 2b, 2c, a corresponding upper voltage capacitor KO1, KO2, KO3 with a capacitance, which is termed upper capacitance C0a, C0b, C0c.

An electrically conductive flange 12, which lies at earth potential or ground potential 13, is arranged at the capacitor bushing 2a. This flange 12 serves for fastening and/or securing the capacitor bushing 2a. The outermost lining 3 forms together with the flange 12 and ground potential 13, as equivalent circuit for each capacitor bushing 2a, 2b, 2c, a corresponding outer capacitor KA1, KA2, KA3 with the capacitance CA1, CA2, CA3.

The measuring adapter 6 penetrates through the insulating body 11 and produces an electrically conductive connection with the outermost lining 3. It is electrically conductively connected with the controller 8 by the respective sensor 7 so as to be able to detect the measured voltage U1a and communicate this to the controller 8. In this embodiment each sensor 7 comprises a measuring capacitor KM1, KM2, KM3 with a capacitance CM1, CM2, CM3, which is connected with ground potential 13. It can, if required, additionally comprise a radio path (not illustrated), which is connected in parallel with the respective measuring capacitor KM1, KM2, KM3, and/or an overvoltage protection means 7', which is connected in parallel with the respective measuring capacitor KM1, KM2, KM3.

The controller 8 is electrically conductively connected with the mains line 5a by the voltage converter 9a. The voltage Ua lying between the mains line 5a and ground potential 13 is detected by this connection. In this embodiment the voltage converter 9a is constructed as a capacitive voltage converter and comprises a capacitive voltage divider, which comprises two capacitors K1, K2 connected in series, and two coils or windings W1, W2, which are connected as a transformer for inductive electrical isolation.

This apparatus 1 is suitable for carrying out and/or can be constructed in such a way as to carry out a method of monitoring capacitor bushings for a three-phase alternating current mains. One embodiment of a method of that kind is described further below.

Figure 3:
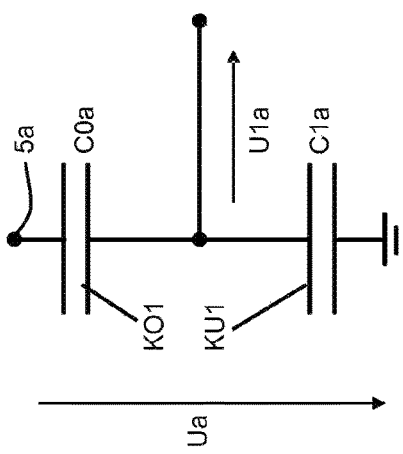
FIG. 3 shows an equivalent circuit consisting of a lower voltage capacitor and an upper voltage capacitor.

An equivalent circuit consisting of the respective lower voltage capacitor KU1 and the respective upper voltage capacitor KO1 is schematically illustrated in FIG. 3 for the first phase Pa. A parallel circuit, which comprises the respective measuring capacitor KM1 and the outer capacitor KA1, forms the lower voltage capacitor KU1 with the lower capacitance C1. This lower capacitance C1 can therefore be easily calculated by the known formula for the series circuit of capacitors from the capacitance CM1 of the measuring capacitor KM1 and the capacitance CA1 of the outer capacitor KA1. If required, the parallel circuit can comprise, instead of the measuring capacitor KM1, the entire respective sensor 7 and/or additionally the controller 8 so that then the capacitance CA1 has to be calculated from the impedance of the sensor 7, which depends on the capacitance CM1, the capacitance CA1 and the impedance of the controller 8.

As mentioned above, the measured voltage U1a lies at the lower voltage capacitor KU1 and is measured at the connecting line or the connecting point between the lower voltage capacitor KU1 and the upper voltage capacitor KO1 and is referred to ground potential 13. The mains voltage Ua drops across the series circuit of the upper voltage capacitor KO1 and the lower voltage capacitor KU1.

Figure 4:
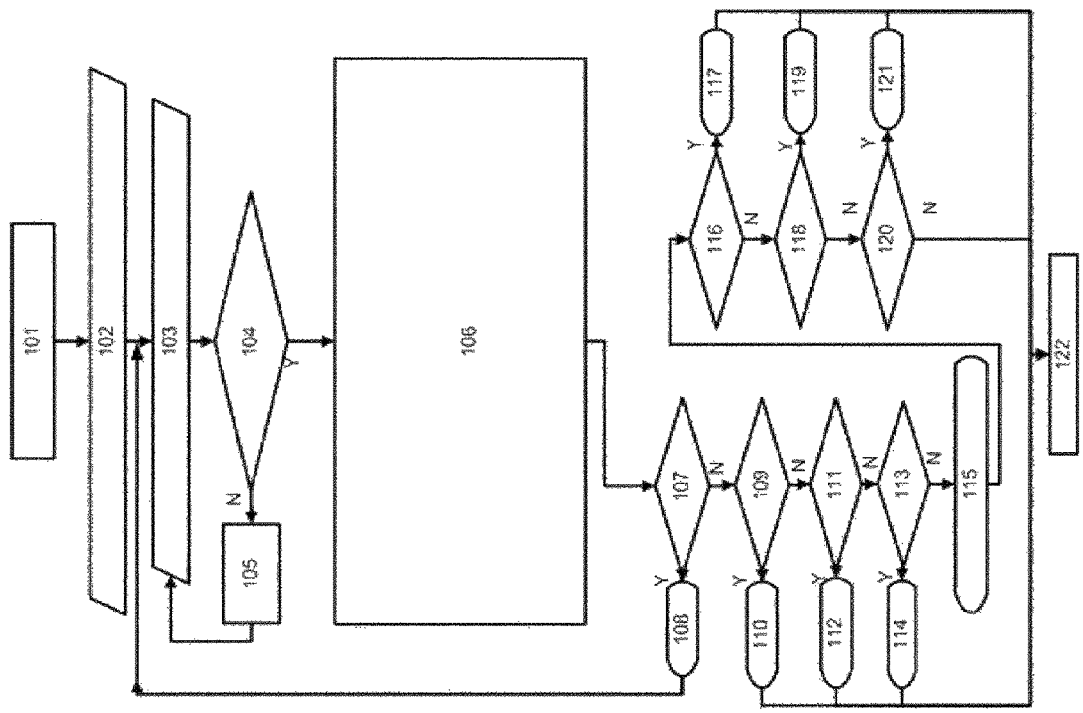
FIG. 4 shows a flowchart of a embodiment of a method of monitoring capacitor bushings for a three-phase alternating current mains.

A flowchart of one embodiment of a method of monitoring capacitor bushings 2a, 2b, 2c for a three-phase alternating current mains is schematically illustrated in FIG. 4. This method can be performed, for example, by and/or with the help of the apparatus 1 of FIG. 1.

In this embodiment the method comprises the following steps, which are explained with reference to the apparatus 1 and FIGS. 1 and 2:

Step 101: Start of the method

Step 102: The upper capacitance C0a, C0b, C0c and the lower capacitance C1a, C1b, C1c are determined for each capacitor bushing 2a, 2b, 2c. These are filed as fixed values.

Step 103: The measured voltage U1a, U1b, U1c is detected at each capacitor bushing 2a, 2b, 2c. The mains voltage Ua, Ub, Uc is detected for each phase Pa, Pb, Pc.

Step 104: The mains voltages Ua, Ub, Uc are recalculated into effective values Uae, Ube, Uce and compared with one another.

In this embodiment provision is made for determination of tolerance values $UAB>0$, $UBC>0$, $UCA>0$ for the voltage comparison and the voltage comparison is carried out in such a way that it is checked whether |Uae−Ube|≤UAB and |Ube−Uce|≤UBC and |Uce−Uae|≤UCA.

If yes, then this means that the voltage comparison has the result that the mains voltages Ua, Ub, Uc do not differ from one another by more than a predetermined amount UAB, UBC, UCA. In this case the Step 106 is carried out.

If no, then this means that the voltage comparison has the result that the mains voltages Ua, Ub, Uc differ from one another by more than a predetermined amount UAB, UBC, UCA. In this case the Step 105 is carried out.

Step 105: A warning signal is generated that indicates a short-circuit in the current mains and/or a too strong or excessive asymmetry of mains voltages Ua, Ub, Uc. Subsequently, there is a jump to Step 103.

Step 106: An actual capacitance C0a', C0b', C0c' is calculated for each capacitor bushing 2a, 2b, 2c, the actual capacitance depending on the respective measured voltage U1a, U1b, U1c, the respective lower capacitance C1a, C1b, C1c as well as on the measured voltage U1b, U1c, U1a, the lower capacitance C1b, C1c, C1a and the upper capacitance C0b, C0c, C0a of one of the other capacitor bushings 2b, 2c, 2a.

In this embodiment it is provided that the actual capacitances C0a', C0b', C0c' of the capacitor bushings 2a, 2b, 2c are calculated by the following formulae:

$$C'_{0a} = C_{1a} \times \frac{U_{1a} \times K_a}{\frac{U_{1b} \times C_{1b}}{C_{0b}} + U_{1b} - U_{1a} \times K_a}$$

where Ka is a correction value for which Ka=Ub/Ua;

$$C'_{0b} = C_{1b} \times \frac{U_{1b} \times K_b}{\frac{U_{1c} \times C_{1c}}{C_{0c}} + U_{1c} - U_{1b} \times K_b}$$

where Kb is a correction value for which Kb=1 or Kb=Uc/Ub; and $$C'_{0c} = C_{1c} \times \frac{U_{1c} \times Kc}{\frac{U_{1a} \times C_{1a}}{C_{0a}} + U_{1a} - U_{1c} \times Kc}$$

where Kc is a correction value for which Kc=Ua/Uc.

Step 107: For each capacitor bushing 2a, 2b, 2c the respective upper capacitance C0a, C0b, C0c is compared with the respective actual capacitance C0a', C0b', C0c'.

In this embodiment provision is made for determination of tolerance values CA>0, CB>0, CC>0 for the capacitance comparisons and the capacitance comparisons are carried out in such a way that it is initially checked whether |C0a'−C0a|<−CA and |C0b'−C0b|CB and |C0c'−C0c|≤CC If yes, the Step 108 is carried out. If no, the Step 109 is carried out.

Step 108: A monitoring signal is generated that indicates that the capacitor bushings 2a, 2b, 2c are in an orderly state. Subsequently, a jump to Step 103 takes place.

Step 109: The capacitance comparisons are additionally carried out in such a way that it is checked whether C0a'−C0a<−CA and C0b'−C0b CB and |C0c'−C0c|≤CC If yes, the Step 110 is carried out. If no, the Step 111 is carried out.

Step 110: A monitoring signal is generated that indicates that at least the second capacitor bushing 2b is not in an orderly state. Subsequently, there is a jump to Step 122.

Step 111: The capacitance comparisons are additionally carried out in such a way that is checked whether C0b'−C0b<−CB and C0c'−C0c CC and |C0a'−C0a|≤CA If yes, the Step 112 is carried out. If no, the Step 113 is carried out.

Step 112: A monitoring signal is generated that indicates that at least the third capacitor bushing 2c is not in an orderly state. Subsequently, there is a jump to Step 122.

Step 113: The capacitance comparisons are additionally carried out in such a way that it is checked whether C0c'−C0c<−CC and C0a'−C0a CA and |C0b'−C0b|≤CB If yes, the Step 114 is carried out. If no, the Step 115 is carried out.

Step 114: A monitoring signal is generated that indicates that at least the first capacitor bushing 2a is not in an orderly state. Subsequently there is a jump to Step 122.

Step 115: A monitoring signal is generated that indicates that at least two capacitor bushings are not in an orderly state.

Step 116: The capacitance comparisons are additionally carried out in such a way that it is checked whether C0a'−C0a<−CA and C0b'−C0b −CB and |C0c'−C0c|≤CC If yes, the Step 117 is carried out. If no, the Step 118 is carried out.

Step 117: A monitoring signal is generate that indicates that the first and the third capacitor bushings 2a, 2c are not in an orderly state and have the same fault. Subsequently there is a jump to Step 122.

Step 118: The capacitance comparisons are additionally carried out in such a way that it is checked whether C0b'−C0b CB and C0c'−C0c<−CC and |C0a'−C0a|≤CA If yes, the Step 119 is carried out. If no, the Step 120 is carried out.

Step 119: A monitoring signal is generated that indicates that the second and first capacitor bushings 2b, 2a are not in an orderly state and have the same fault. Subsequently, there is a jump to Step 122.

Step 120: The capacitance comparisons are additionally carried out in such a way that it is checked whether C0c'−C0c CC and C0a'−C0a<−CA and |C0b'−C0b|≤CB If yes, the Step 121 is carried out. If no, the Step 122 is carried out.

Step 121: A monitoring signal is generated that indicates that the third and second capacitor bushings 2c, 2b are not in an orderly state and have the same fault. Subsequently, there is a jump to Step 122.

Step 122: A monitoring signal is generated that indicates that at least two capacitor bushings are not in an orderly state and have different faults. Subsequently, the method is ended or, if required, there is a jump to Step 103.

Step 102 can be carried out, for example, by the controller 8.

Step 103 can be carried out, for example, on the one hand by the measuring adapter 6, the sensors 7 and the controller 8, which thus form means constructed in such a way as to detect at each capacitor bushing 2a, 2b, 2c a measured voltage U1a, U1b, U1c lying between the respecting lining 3 and a ground potential 13, and on the other hand by the voltage converter 9a, 9b, 9c and the controller 8, which thus together form means constructed in such a way as to detect the mains voltages Ua, Ub, Uc of each phase Pa, Pb, Pc.

Steps 104 and 105 can be carried out, for example, by the controller 8, which thus forms means constructed in such a way as to compare the mains voltages Ua, Ub, Uc with one another.

Step 106 can be carried out, for example, by the controller 8, which thus forms means constructed in such a way as to calculate for each capacitor bushing 2a an actual capacitance C0a', C0b', C0c', which depends on the respective measured voltage U1a, U1b, U1c, a lower capacitance C1a, C1b, C1c of the respective capacitor bushing 2a, 2b, 2c as well as on the measured voltage U1b, U1c, U1a, a lower capacitance C1b, C1c, C1a and an upper capacitance C0b, C0c, C0a of one of the other capacitor bushings 2b, 2c, 2a.

Steps 107, 109, 111, 113, 116, 118 and 120 can be carried out, for example, by the controller 8, which thus forms means constructed in such a way as to compare for each capacitor bushing 2a, 2b, 2c the respective upper capacitance C0a, C0b, C0c with the respective actual capacitance C0a', C0b', C0c'.

Steps 108, 110, 112, 114, 115, 117, 119, 121 and 122 can be carried out, for example, by the controller 8, which thus forms means constructed in such a way as to generate a monitoring signal dependent on the results of the capacitance comparisons.

The invention claimed is:

1. A method of monitoring capacitor bushings for a three-phase alternating current mains, where each capacitor bushing comprises a conductor connected with one of the mains lines of the alternating current mains, and an electrically conductive lining surrounding the conductor, the method comprising the steps of:
determining an upper capacitance and a lower capacitance for each capacitor bushing;
detecting a measured voltage present between the respective lining and a ground potential at each capacitor bushing;
calculating an actual capacitance for each capacitor bushing, the actual capacitance depending on the respective measured voltage and the respective lower capacitance as well as on the measured voltage, the lower capacitance, and the upper capacitance of one of the other capacitor bushings;
for each capacitor bushing comparing the respective upper capacitance with the respective actual capacitance; and
generating a monitoring signal dependent on the results of the capacitance comparison.

2. The method according to claim 1, further comprising the steps of:
detecting the mains voltage for each phase;
comparing the detected mains voltages with one another; and
if the voltage comparison has the result that the mains voltages differ from one another by not more than a predetermined amount carrying out the calculation of the actual capacitances, the comparison of the capacitances and the generation of the monitoring signal.

3. The method according to claim 2, wherein effective values and/or peak values and/or amplitudes of the mains voltages are used in the voltage comparison.

4. The method according to claim 3, further comprising the steps of:
determining tolerance values UAB>0, UBC>0, UCA>0 for the voltage comparison; and
carrying out the voltage comparison to check whether |Uae−Ube|≤UAB and |Ube−Uce|≤UBC and |Uce−Uae|≤UCA.

5. The method according to claim 1, wherein the actual capacitance of the first capacitor bushing is calculated according to the following formula:

$$C'_{0a} = C_{1a} \times \frac{U_{1a} \times K_a}{\frac{U_{1b} \times C_{1b}}{C_{0b}} + U_{1b} - U_{1a} \times K_a}$$

where Ka is a correction value for which Ka=1 or Ka=Ub/Ua; and/or
the actual capacitance of the second capacitor bushing is calculated according to the following formula:

$$C'_{0b} = C_{1b} \times \frac{U_{1b} \times K_b}{\frac{U_{1c} \times C_{1c}}{C_{0c}} + U_{1c} - U_{1b} \times K_b}$$

where Kb is a correction value for which Kb=1 or Kb=Uc/Ub; and/or
the actual capacitance of the third capacitor bushing is calculated according to the following formula:

$$C'_{0c} = C_{1c} \times \frac{U_{1c} \times K_c}{\frac{U_{1a} \times C_{1a}}{C_{0a}} + U_{1a} - U_{1c} \times K_c}$$

where Kc is a correction value for which Kc=1 or Kc=Ua/Uc.

6. The method according to claim 1, wherein
tolerance values CA>0, CB>0, CC>0 for the capacitance comparisons are determined; and
if the capacitance comparisons have the result that |C0a'−C0a|≤CA and |C0b'−C0b|≤CB and |C0c'−C0c|≤CC
a monitoring signal is generated that indicates that the capacitor bushings are in an orderly state.

7. The method according to claim 6, wherein otherwise a monitoring signal is generated that indicates that at least one capacitor bushing is not in an orderly state.

8. The method according to claim 1, further comprising the steps of:
determining tolerance values CA>0, CB>0, CC>0 for the capacitance comparisons;
if the capacitance comparisons have the result that C0a'−C0a<−CA and C0b'−C0b CB and |C0c'−C0c|≤CC
generating a monitoring signal that indicates that at least the second capacitor bushing is not in an orderly state;
if the capacitance comparisons have the result that C0b'−C0b<−CB and C0c'−C0c CC and |C0a'−C0a|≤CA
generating a monitoring signal that indicates that at least the third capacitor bushing is not in an orderly state; and
if the capacitance comparisons have the result that C0c'−C0c<−CC and C0a'−C0a CA and |C0b'−C0b|≤CB
generating a monitoring signal that indicates that at least the first capacitor bushing is not in an orderly state.

9. The method according to claim 8, wherein
otherwise a monitoring signal is generated that indicates that at least two capacitor bushings are not in an orderly state.

10. The method according to claim 1, further comprising the steps of:
determining tolerance values CA>0, CB>0, CC>0 for the capacitance comparisons;
if the capacitance comparisons have the result that C0a'−C0a CA and C0b'−C0b<−CB and |C0c'−C0c|≤CC
generating a monitoring signal that indicates that the first and third capacitor bushings are not in an orderly state and have an identical fault;
if the capacitance comparisons have the result that C0b'−C0b CB and C0c'−C0c<−CC and |C0a'−C0a|≤CA generating a monitoring signal that indicates that the second and first capacitor bushings are not in an orderly state and have an identical fault; and if the capacitance comparisons have the result that $C0c'-C0c$ CC and $C0a'-C0a < -CA$ and $|C0b'-C0b| \leq CB$ generating a monitoring signal that indicates that the third and second capacitor bushings are not in an orderly state and have an identical fault.

11. An apparatus for monitoring capacitor bushings for a three-phase alternating current mains, wherein each capacitor bushing comprises a conductor, which is connected with the one of the mains lines of the alternating current mains, and an electrically conductive lining surrounding the conductor, where the apparatus is constructed for carrying out a method according to and comprises:
   a sensor;
   a measuring adapter for each phase, which adaptor can be connected with the lining of the capacitor bushing belonging to the respective phase and is connected with the sensor so as to detect a first electrical measurement variable; and
   a controller that is connected with the sensor so as to communicate the first measurement variable to the controller.

12. The apparatus according to claim 11, additionally comprising:
   a voltage converter for each phase, which converter can be connected with the mains line belonging to the respective phase so as to detect a second electrical measurement variable and is connected with the controller so as to communicate the second measurement variable to the controller.

13. The apparatus according to claim 12, wherein each voltage converter is constructed as a capacitive voltage converter or inductive voltage converter or resistive voltage converter.

14. The apparatus according to claim 13, wherein the sensor comprises at least one measuring capacitor.

15. The apparatus according to claim 14, wherein the sensor comprises three measuring capacitors;
   in each phase a measuring adapter is connected with a measuring capacitor associated therewith; and
   the capacitances of these three measuring capacitors are different.

16. The apparatus according to claim 15, wherein the three capacitances are in the ratio 1:2:3, 1:2:4, 1:2:5, 1:3:5, 1:3:7, 1:3:9, 1:4:7 or 1:4:9.

17. The apparatus according claim 11, wherein:
   the first electrical measurement variables are voltages respectively present at a lower voltage capacitor of the corresponding phase.

18. The apparatus according to claim 11, wherein the second electrical measurement variables are voltages respectively present between the corresponding mains line and ground potential.

19. The apparatus according to any claim 11, wherein the controller is so constructed that it can calculate an actual capacitance for each capacitor bushing, the actual capacitance depending on the respective measured voltage and a lower capacitance of the respective capacitor bushing as well as on the measurement voltage, a lower capacitance and an upper capacitance of one of the other capacitor bushings.

20. The apparatus according to claim 11, wherein the controller is so constructed that it can compare the respective upper capacitance with the respective actual capacitance for each capacitor bushing.

21. An apparatus for monitoring capacitor bushings for a three-phase alternating current mains, wherein each capacitor bushing comprises a conductor, which is connected with the one of the mains lines of the alternating current mains, and an electrically conductive lining surrounding the conductor, wherein the apparatus is constructed as an apparatus for carrying out a method according to claim 1 and comprises
   means constructed to detect at each capacitor bushing a measurement voltage present between the respective lining and a ground potential;
   means constructed to calculate for each capacitor bushing an actual capacitance that depends on the respective measurement voltage and a lower capacitance of the respective capacitor bushing as well as on the measurement voltage, a lower capacitance and an upper capacitance of one of the other capacitor bushings;
   means constructed to compare the respective upper capacitance with the respective actual capacitance for each capacitor bushing; and
   means constructed to produce a monitoring signal dependent on the results of the capacitance comparisons.

22. The apparatus according to claim 21, additionally comprising
   means constructed to detect the mains voltages of each phase;
   means constructed to compare the mains voltages with one another; and
   means constructed to cause or carry out calculation of the actual capacitances, comparison of the capacitances and generation of the monitoring signal if the voltage comparison has the result that the mains voltages differ from one another by not more than a predetermined amount.

* * * * *